United States Patent
Fukushima

(10) Patent No.: US 11,007,579 B2
(45) Date of Patent: May 18, 2021

(54) COATED CUTTING TOOL

(71) Applicant: TUNGALOY CORPORATION, Fukushima (JP)

(72) Inventor: Naoyuki Fukushima, Iwaki (JP)

(73) Assignee: TUNGALOY CORPORATION, Iwaki (JP)

(*) Notice: Subject to any disclaimer, the term of this patent is extended or adjusted under 35 U.S.C. 154(b) by 0 days.

(21) Appl. No.: 16/554,067

(22) Filed: Aug. 28, 2019

(65) Prior Publication Data

US 2020/0070253 A1    Mar. 5, 2020

(30) Foreign Application Priority Data

Sep. 4, 2018  (JP) .............................. JP2018-165117

(51) Int. Cl.
  *B23B 27/14*   (2006.01)
  *C23C 16/36*   (2006.01)
  *C23C 16/40*   (2006.01)

(52) U.S. Cl.
  CPC ............ *B23B 27/148* (2013.01); *C23C 16/36* (2013.01); *C23C 16/403* (2013.01); *B23B 2228/105* (2013.01)

(58) Field of Classification Search
  CPC ... B23B 27/14; B23B 2228/105; C23C 16/36; C23C 16/40; C23C 16/403
  USPC .......... 51/307, 309; 428/216, 336, 698, 701, 428/702
  See application file for complete search history.

(56) References Cited

U.S. PATENT DOCUMENTS

| 5,871,850 A | 2/1999 | Moriguchi et al. |
| 2006/0035111 A1* | 2/2006 | Osada ................ C23C 16/32 428/698 |
| 2017/0029944 A1* | 2/2017 | Kubo ................ C23C 10/28 |

(Continued)

FOREIGN PATENT DOCUMENTS

| EP | 0 732 423 A1 | 6/1996 |
| EP | 1 626 105 A1 | 2/2006 |

(Continued)

OTHER PUBLICATIONS

Sakari Ruppi et al., "Enhanced Performance of α-Al2O3 Coatings by Control of Crystal Orientation", Surface and Coatings Technology, vol. 202, Issue 17, May 25, 2008, pp. 4257-4269, doi:10.1016/j.surfcoat.2008.03.021.

*Primary Examiner* — Archene A Turner
(74) *Attorney, Agent, or Firm* — Studebaker & Brackett PC

(57) ABSTRACT

A coated cutting tool comprising a substrate and a coating layer formed on a surface of the substrate, wherein: the coating layer comprises a lower layer, an intermediate layer and an upper layer, the lower layer, the intermediate layer and the upper layer being laminated in order from the substrate side toward a surface side of the coating layer; the lower layer comprises a Ti compound layer; the intermediate layer contains $\alpha\text{-}Al_2O_3$; the upper layer contains TiCN; an average thickness of each of the lower layer, the intermediate layer, and the upper layer is within a specific range; a ratio of a length of $\Sigma 3$ grain boundaries to a total 100% length of all grain boundaries in a specific region of the upper layer is from 20% or more to 60% or less; and a ratio of (111)-oriented grains in the upper layer is 30 area % or more.

20 Claims, 1 Drawing Sheet

(56) References Cited

U.S. PATENT DOCUMENTS

2017/0275765 A1 9/2017 Stiens et al.
2019/0160547 A1 5/2019 Takahashi et al.

FOREIGN PATENT DOCUMENTS

| EP | 3 000 913 A1 | | 3/2016 |
|---|---|---|---|
| JP | H01-104773 A | | 4/1989 |
| JP | H04-103754 A | | 4/1992 |
| JP | H08-90310 A | | 4/1996 |
| JP | H08-158052 A | | 6/1996 |
| JP | 2004-322226 A | | 11/2004 |
| JP | 2007-260851 A | | 10/2007 |
| JP | 2009-056538 A | | 3/2009 |
| JP | 2010-207977 A | | 9/2010 |
| JP | 2012-192480 | * | 10/2012 |
| JP | 2012-196726 A | | 10/2012 |
| JP | 2013-208698 A | | 10/2013 |
| JP | 2015-182154 A | | 10/2015 |
| JP | 2017-530019 A | | 10/2017 |
| JP | 2019-098430 A | | 6/2019 |

\* cited by examiner

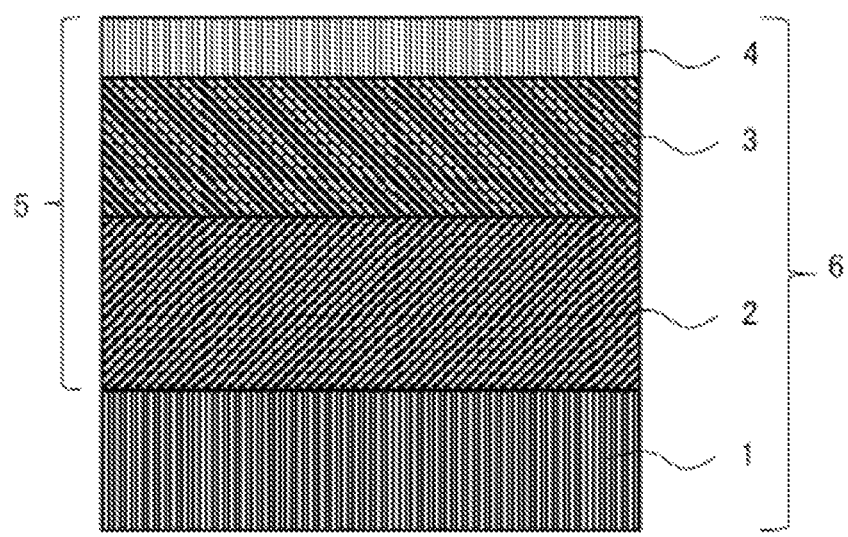

COATED CUTTING TOOL

TECHNICAL FIELD

The present invention relates to a coated cutting tool.

BACKGROUND ART

It is well known that a conventional coated cutting tool used for the cutting of steel, cast iron, etc., is a coated cutting tool which is obtained by depositing, via chemical vapor deposition, a coating layer with a total thickness of from 3 µm or more to 20 µm or less on a surface of a substrate consisting of a cemented carbide. A known example of the above coating layer is a coating layer consisting of a single layer of one kind selected from the group consisting of a Ti carbide, a Ti nitride, a Ti carbonitride, a Ti carboxide, a Ti oxycarbonitride, and aluminum oxide, or consisting of multiple layers of two or more kinds selected therefrom.

For example, JP2017-530019 T discloses a coated cutting tool consisting of a substrate of a cemented carbide, cermet, ceramic, steel or cubic boron nitride and a multi-layered wear resistant coating having a total coating thickness of from 5 µm or more to 25 µm or less and comprising at least two refractory coating layers deposited by chemical vapor deposition (CVD) or moderate temperature chemical vapor deposition (MT-CVD), the at least two refractory coating layers including a first coating layer and a second coating layer being deposited on top of each other, wherein the first coating layer consists of titanium aluminum nitride or titanium aluminum carbonitride $Ti_{1-u}Al_uC_vN_w$, with $0.2 \leq u \leq 1.0$, $0 \leq v \leq 0.25$ and $0.7 \leq w \leq 1.15$, and is deposited by CVD at a reaction temperature ranging from 600° C. or higher to 900° C. or lower, the second coating layer consists of titanium carbonitride $Ti_xC_yN_{1-y}$, with $0.85 \leq x \leq 1.1$ and $0.4 \leq y \leq 0.85$, and is deposited on top of the first coating layer by MT-CVD at a reaction temperature ranging from 600° C. or higher to 900° C. or lower, wherein the second $Ti_xC_yN_{1-y}$ coating layer has a columnar grain morphology and the overall fiber texture of the $Ti_xC_yN_{1-y}$ coating layer is characterized by a texture coefficient TC (111)>2.

SUMMARY

Technical Problem

An increase in feed and depth of cut has become more conspicuous in cutting in recent times, and the wear resistance of a tool and the fracture resistance thereof are required to be further improved compared to those involved in the prior art. In particular, machining under conditions which allow for a high-feed-rate and a large depth of cut for steel has increasingly involved cutting which places a large load on a coated cutting tool. Under the severe cutting conditions described above, a conventional tool is accompanied by the occurrence of crater wear and fracturing due to the falling of grains from a coating layer of such tool. This triggers a problem in that the tool life cannot be extended. The coated cutting tool disclosed in JP2017-530019 T does not include an $\alpha$-$Al_2O_3$ layer and therefore has insufficient wear resistance in machining in which crater wear is likely to progress. Further, in the above-described cutting tool, since a TiCN layer is formed by MT-CVD at a reaction temperature of from 600° C. or higher to 900° C. or lower, this can be inferred to indicate a high ratio of boundaries of crystal grains (hereinafter referred to as "grain boundaries") with relatively high grain boundary energy, and it can therefore be considered that crater wear resistance is insufficient.

The present invention has been made in light of the above circumstances, and an object of the present invention is to provide a coated cutting tool which has excellent wear resistance and fracture resistance and which accordingly allows for an extended tool life.

Solution to Problem

The present inventor has conducted studies regarding extending the tool life of a coated cutting tool from the above-described perspective and has then found that the following configurations in which: a lower layer including a Ti compound layer, an intermediate layer containing $\alpha$-$Al_2O_3$ and an upper layer containing TiCN, are laminated in this order so as to form a coating layer; a ratio of (111)-oriented grains is controlled in the upper layer; and the upper layer, including a TiCN layer in which the ratio of grain boundaries with relatively low grain boundary energy falls within a specific range, has a specific thickness, allow for the suppression of wear caused until the cutting temperature has been increased and also allow for the suppression of the falling of grains from an $\alpha$-$Al_2O_3$ layer, and accordingly enable both wear resistance and fracture resistance to be improved, and has further found that, as a result, the tool life of the coated cutting tool can be extended, and this has led to the completion of the present invention.

Namely, the present invention is as set forth below:

[1] A coated cutting tool comprising a substrate and a coating layer formed on a surface of the substrate, wherein:

the coating layer comprises a lower layer, an intermediate layer and an upper layer, the lower layer, the intermediate layer and the upper layer being laminated in order from the substrate side toward a surface side of the coating layer;

the lower layer comprises one Ti compound layer or two or more Ti compound layers containing a Ti compound of Ti and an element of at least one kind selected from the group consisting of C, N, O and B;

the intermediate layer contains $\alpha$-$Al_2O_3$;

the upper layer contains TiCN;

an average thickness of the lower layer is from 4.0 µm or more to 10.0 µm or less;

an average thickness of the intermediate layer is from 3.0 µm or more to 10.0 µm or less;

an average thickness of the upper layer is from 1.5 µm or more to 6.5 µm or less;

a ratio of a length of $\Sigma 3$ grain boundaries to a total 100% length of all grain boundaries in a specific region of the upper layer is from 20% or more to 60% or less; and a ratio of (111)-oriented grains in the upper layer is 30 area % or more.

[2] The coated cutting tool according to [1], wherein the ratio of (111)-oriented grains in the upper layer is 55 area % or less.

[3] The coated cutting tool according to [1] or [2], wherein a content of chlorine (Cl) in the upper layer is 0.1 atom % or less.

[4] The coated cutting tool according to any of [1] to [3], wherein an average thickness of the coating layer is from 10.0 µm or more to 25.0 µm or less.

[5] The coated cutting tool according to any of [1] to [4], wherein the Ti compound layer is at least one kind selected from the group consisting of TiN, TiC, TiCN, TiCNO, TiON and $TiB_2$.

[6] The coated cutting tool according to any of [1] to [5], wherein the substrate is a cemented carbide, cermet, ceramic or a cubic boron nitride sintered body.

Advantageous Effects of Invention

The present invention can provide a coated cutting tool which has excellent wear resistance and fracture resistance and which accordingly allows for an extended tool life.

BRIEF DESCRIPTION OF DRAWINGS

The FIGURE is a schematic view showing an example of a coated cutting tool according to the present invention.

DESCRIPTION OF EMBODIMENTS

An embodiment for carrying out the present invention (hereinafter simply referred to as the "present embodiment") will hereinafter be described in detail, with reference to the attached drawings as appropriate. However, the present invention is not limited to the present embodiment below. Various modifications may be made to the present invention without departing from the gist of the invention. In the drawings, unless otherwise specified, positional relationships, such as vertical and horizontal relationships, are based on the positional relationships shown in the drawings. Further, the dimensional ratios of the drawings are not limited to those shown therein.

A coated cutting tool according to the present embodiment is a coated cutting tool comprising a substrate and a coating layer formed on a surface of the substrate, wherein: the coating layer comprises a lower layer, an intermediate layer and an upper layer, the lower layer, the intermediate layer and the upper layer being laminated in order from the substrate side toward a surface side of the coating layer; the lower layer comprises one Ti compound layer or two or more Ti compound layers containing a Ti compound of Ti and an element of at least one kind selected from the group consisting of C, N, O and B; the intermediate layer contains $\alpha$-$Al_2O_3$; the upper layer contains TiCN; an average thickness of the lower layer is from 4.0 μm or more to 10.0 μm or less; an average thickness of the intermediate layer is from 3.0 μm or more to 10.0 μm or less; an average thickness of the upper layer is from 1.5 μm or more to 6.5 μm or less; a ratio of a length of $\Sigma 3$ grain boundaries to a total 100% length of all grain boundaries in a specific region of the upper layer is from 20% or more to 60% or less; and a ratio of (111)-oriented grains in the upper layer is 30 area % or more.

The coated cutting tool of the present embodiment comprises the above-described configurations, and this allows the wear resistance and fracture resistance of the coated cutting tool to be improved; as a result, the tool life thereof can be extended. The factors for the improvements in wear resistance and fracture resistance of the coated cutting tool of the present embodiment can be considered to be set forth as follows. However, the present invention is not in any way limited by the factors set forth below. In other words, firstly, the coated cutting tool of the present embodiment includes, as the lower layer of the coating layer, at least one Ti compound layer containing a Ti compound of Ti and an element of at least one kind selected from the group consisting of C, N, O and B. If the coated cutting tool of the present embodiment comprises such lower layer between the substrate and the intermediate layer containing $\alpha$-aluminum oxide ($\alpha$-$Al_2O_3$), this leads to improved wear resistance and adhesion. In the coated cutting tool of the present embodiment, if the average thickness of the lower layer is 4.0 μm or more, this leads to improved wear resistance, whereas, if the average thickness of the lower layer is 10.0 μm or less, the peeling of the coating layer is suppressed, and this mainly serves as a factor for achieving improved fracture resistance. In the coated cutting tool of the present embodiment, if the average thickness of the intermediate layer containing $\alpha$-$Al_2O_3$ is 3.0 μm or more, this indicates the tendency of the crater wear resistance in the rake surface to be further improved, whereas, if the average thickness of the intermediate layer containing $\alpha$-$Al_2O_3$ is 10.0 μm or less, this indicates the tendency of the fracture resistance to be further improved as the peeling of the coating layer is further suppressed. In the coated cutting tool of the present embodiment, the upper layer containing TiCN serves as a layer exterior to the intermediate layer containing $\alpha$-$Al_2O_3$, whereby the TiCN layer of the upper layer comes into contact with a workpiece material before the $\alpha$-$Al_2O_3$ layer. Thus, the coated cutting tool of the present embodiment allows for the suppression of crater wear in the $Al_2O_3$ layer which would otherwise be caused, particularly until the cutting temperature has been increased. While the mechanism here has not been made clear, the reason for the above suppression can be inferred to be that, with regard to a hardness at a low temperature, such hardness of the TiCN layer is higher than that of the $\alpha$-$Al_2O_3$ layer. In the coated cutting tool of the present embodiment, the upper layer has a high hardness since it contains TiCN, thereby resulting in improved wear resistance. Further, in the coated cutting tool of the present embodiment, if a ratio of a length of $\Sigma 3$ grain boundaries to a total 100% length of all grain boundaries in a specific region of the upper layer containing TiCN is 20% or more, this indicates a high ratio of grain boundaries with relatively low grain boundary energy. In the coated cutting tool of the present embodiment, lower grain boundary energy leads to improved mechanical properties, thereby resulting in improved crater wear resistance. In the coated cutting tool of the present embodiment, if a ratio of a length of $\Sigma 3$ grain boundaries to a total 100% length of all grain boundaries in a specific region of the upper layer containing TiCN is 60% or less, this can prevent the crystal grains from being coarse, thereby resulting in improved chipping resistance. In the coated cutting tool of the present embodiment, if a ratio of (111)-oriented grains in the upper layer containing TiCN is 30 area % or more, this leads to a high hardness, thereby resulting in excellent crater resistance. In the coated cutting tool of the present embodiment, if the average thickness of the upper layer is 1.5 μm or more, this achieves the effect of providing the upper layer, whereas, if the average thickness of the upper layer is 6.5 μm or less, the peeling of the coating layer is suppressed, and this mainly serves as a factor for improved fracture resistance. The combining of the above configurations allows for the coated cutting tool of the present embodiment to have improved wear resistance and fracture resistance, and accordingly, it can be considered that the tool life can be extended.

The FIGURE is a schematic cross-sectional view showing an example of a coated cutting tool according to the present embodiment. A coated cutting tool 6 is provided with a substrate 1 and a coating layer 5 located on a surface of the substrate 1, and a lower layer 2, an intermediate layer 3 and an upper layer 4 are laminated in this order in an upward direction in the coating layer 5.

A coated cutting tool according to the present embodiment comprises a substrate and a coating layer formed on a surface of the substrate. Specific examples of types of the coated cutting tool include an indexable cutting insert for milling or turning, a drill and an end mill.

The substrate used in the present embodiment is not particularly limited, as long as it may be used as a substrate for a coated cutting tool. Examples of such substrate include a cemented carbide, cermet, ceramic, a cubic boron nitride sintered body, a diamond sintered body and high-speed steel. From among the above examples, the substrate is preferably comprised of a cemented carbide, cermet, ceramic or a cubic boron nitride sintered body as this provides further excellent wear resistance and fracture resistance, and, from the same perspective, the substrate is more preferably comprised of a cemented carbide.

It should be noted that the surface of the substrate may be modified. For instance, when the substrate is comprised of a cemented carbide, a β-free layer may be formed on the surface thereof, and when the substrate is comprised of cermet, a hardened layer may be formed on the surface thereof. The operation and effects of the present invention are still provided even if the substrate surface has been modified in this way.

As to the coating layer used in the present embodiment, the average thickness thereof is preferably from 10.0 μm or more to 25.0 μm or less. In the coated cutting tool of the present embodiment, if the average thickness of the coating layer is 10.0 μm or more, this leads to improved wear resistance, and if the average thickness of the coating layer is 25.0 μm or less, the peeling of the coating layer is suppressed, and this mainly serves as a factor for improved fracture resistance. It should be noted that, as to the average thickness of each layer and the average thickness of the entire coating layer in the coated cutting tool of the present embodiment, each of such average thicknesses can be obtained by: measuring the thickness of each layer or the thickness of the entire coating layer from each of the cross-sectional surfaces at three or more locations in each layer or in the entire coating layer; and then calculating the arithmetic mean of the resulting measurements.

[Lower Layer]

The lower layer used in the present embodiment comprises one Ti compound layer or two or more Ti compound layers containing a Ti compound of Ti and an element of at least one kind selected from the group consisting of C, N, O and B. If the coated cutting tool of the present embodiment comprises such lower layer between a substrate and an intermediate layer containing α-aluminum oxide (α-$Al_2O_3$), this leads to improved wear resistance and adhesion.

Examples of the Ti compound layers include a TiC layer containing TiC, a TiN layer containing TiN, a TiCN layer containing TiCN, a TiCO layer containing TiCO, a TiCNO layer containing TiCNO, a TiON layer containing TiON and a $TiB_2$ layer containing $TiB_2$.

The lower layer may be constituted by a single layer or multiple layers (for example, two or three layers). However, the lower layer is preferably constituted by multiple layers, is more preferably constituted by two or three layers, and is further preferably constituted by three layers. From the perspective of further improving wear resistance and adhesion, the lower layer preferably comprises a layer of at least one kind selected from the group consisting of a TiN layer, a TiC layer, a TiCN layer, a TiCNO layer, a TiON layer and a $TiB_2$ layer. In the coated cutting tool of the present embodiment, if at least one layer of the lower layer is a TiCN layer, this indicates the tendency of the wear resistance to be further improved. In the coated cutting tool of the present embodiment, if at least one layer of the lower layer is a TiN layer and if such TiN layer is formed on a surface of a substrate, this indicates the tendency of the adhesion to be further improved. In the coated cutting tool of the present embodiment, if at least one layer of the lower layer is a TiCNO layer and if such TiCNO layer is formed so as to come into contact with the intermediate layer containing α-$Al_2O_3$, this indicates the tendency of the adhesion to be further improved. When the lower layer is constituted by three layers: a TiC layer or a TiN layer, serving as a first layer, may be formed on a surface of the substrate; a TiCN layer, serving as a second layer, may be formed on a surface of the first layer; and a TiCNO layer or a TiCO layer, serving as a third layer, may be formed on a surface of the second layer. In particular, as to the lower layer: a TiN layer, serving as a first layer, may be formed on a surface of the substrate; a TiCN layer, serving as a second layer, may be formed on a surface of the first layer; and a TiCNO layer, serving as a third layer, may be formed on a surface of the second layer.

The average thickness of the lower layer used in the present embodiment is from 4.0 μm or more to 10.0 μm or less. In the coated cutting tool of the present embodiment, if the average thickness of the lower layer is 4.0 μm or more, this leads to improved wear resistance. Meanwhile, in the coated cutting tool of the present embodiment, if the average thickness of the lower layer is 10.0 μm or less, the peeling of the coating layer is suppressed, and this mainly serves as a factor for improved fracture resistance.

The average thickness of the TiC layer or the TiN layer, from the perspective of further improving wear resistance and fracture resistance, is preferably from 0.05 μm or more to 1.0 μm or less. From the same perspective, the average thickness of the TiC layer or the TiN layer is more preferably from 0.10 μm or more to 0.5 μm or less, and is further preferably from 0.15 μm or more to 0.3 μm or less.

The average thickness of the TiCN layer, from the perspective of further improving wear resistance and fracture resistance, is preferably from 3.0 μm or more to 10.0 μm or less. From the same perspective, the average thickness of the TiCN layer is more preferably from 3.5 μm or more to 9.5 μm or less, and is further preferably from 4.0 μm or more to 9.0 μm or less.

The average thickness of the TiCNO layer or the TiCO layer, from the perspective of further improving wear resistance and fracture resistance, is preferably from 0.1 μm or more to 1.0 μm or less. From the same perspective, the average thickness of the TiCNO layer or the TiCO layer is more preferably from 0.2 μm or more to 0.5 μm or less.

The Ti compound layer is a layer containing a Ti compound of Ti and an element of at least one kind selected from the group consisting of C, N, O and B. However, such Ti compound layer may contain a very small amount of components other than the above elements, as long as it provides the operation and effects of the lower layer.

[Intermediate Layer]

The intermediate layer used in the present embodiment contains α-$Al_2O_3$.

The average thickness of the intermediate layer used in the present embodiment is from 3.0 μm or more to 10.0 μm or less. If the average thickness of the intermediate layer containing α-$Al_2O_3$ is 3.0 μm or more, this indicates the tendency of the crater wear resistance in the rake surface of the coated cutting tool to be further improved, and, if the average thickness of the intermediate layer containing α-$Al_2O_3$ is 10.0 μm or less, this indicates the tendency of the fracture resistance of the coated cutting tool to be further improved as the peeling of the coating layer is further suppressed.

The intermediate layer may contain α-aluminum oxide (α-Al$_2$O$_3$), and may or may not contain components other than α-aluminum oxide (α-Al$_2$O$_3$), as long as it provides the operation and effects of the present invention.

[Upper Layer]

The upper layer used in the present embodiment contains TiCN. In the coated cutting tool of the present embodiment, the upper layer containing TiCN leads to a high hardness, thereby resulting in improved wear resistance. Further, in the coated cutting tool of the present embodiment, the upper layer containing TiCN serves as a layer exterior to the intermediate layer containing α-Al$_2$O$_3$. Since, in the coated cutting tool of the present embodiment, the upper layer containing TiCN serves as a layer exterior to the intermediate layer containing α-Al$_2$O$_3$, the TiCN layer of the upper layer comes into contact with a workpiece material before the α-Al$_2$O$_3$ layer. Thus, the coated cutting tool of the present embodiment particularly allows for the suppression of crater wear of the α-Al$_2$O$_3$ layer which would otherwise be caused until the cutting temperature has been increased.

In the coated cutting tool of the present embodiment, a ratio of a length of Σ3 grain boundaries to a total 100% length of all grain boundaries in a specific region of the upper layer is from 20% or more to 60% or less. If the ratio of a length of Σ3 grain boundaries to a total 100% length of all grain boundaries in a specific region of the upper layer containing TiCN is 20% or more, this leads to a high ratio of grain boundaries with relatively low grain boundary energy. In the coated cutting tool of the present embodiment, if the ratio of grain boundaries with relatively low grain boundary energy is high, this leads to improved mechanical properties, thereby resulting in improved crater wear resistance. In the coated cutting tool of the present embodiment, if the ratio of a length of Σ3 grain boundaries to a total 100% length of all grain boundaries in a specific region of the upper layer containing TiCN is 60% or less, this can prevent the crystal grains from being coarse, thereby resulting in improved chipping resistance. From the same perspective, the ratio of a length of Σ3 grain boundaries to a total 100% length of all grain boundaries in a specific region of the upper layer is preferably 55% or less, and is more preferably 50% or less. Herein, the specific region of the upper layer refers to a region of the upper layer which is observed with a scanning electron microscope (hereinafter, also referred to as an "SEM") involving the electron back scatter diffraction described below (hereinafter also referred to as "EBSD").

The upper layer containing TiCN in the present embodiment comprises grain boundaries with relatively high grain boundary energy and grain boundaries with relatively low grain boundary energy. In general, grain boundaries involve irregular alignment of atoms and are accompanied by random arrangements of atoms and therefore have many pores; thus, such grain boundaries have relatively high grain boundary energy. Meanwhile, some grain boundaries involve regular alignment of atoms and therefore have few pores; thus, such grain boundaries have relatively low grain boundary energy. Such grain boundaries with relatively low grain boundary energy are typified by coincidence site lattice grain boundaries (hereinafter referred to as "CSL grain boundaries"). Grain boundaries have the same significant influence on important sintering processes, including densification, creep and diffusion, as the influence exerted on electrical, optical and mechanical properties. The importance of grain boundaries depends on several factors, for example, the density of grain boundaries in a material, the chemical composition of the interface and the crystallographic texture (i.e., grain boundary plane orientations and grain misorientations). CSL grain boundaries play a special role. A Σ value is known as an index of the degree of a distribution of CSL grain boundaries, and such Σ value is defined as a ratio of the density of lattice sites of two grains which come into contact with each other at the grain boundary to the density of coincidence lattice sites when the two lattices are overlapped with each other. For simple structures, it is generally considered that grain boundaries with low Σ values tend to have low interfacial energy and special properties. Therefore, the controlling of the ratio of CSL grain boundaries and the distribution of grain misorientations can be considered to be important for the properties of the upper layer and improvements in such properties.

In recent years, an SEM-based technique known as EBSD has been used in the study of grain boundaries in materials. EBSD is based on automatic analysis of Kikuchi diffraction patterns generated by backscattered electrons.

As to each grain of a subject material, the crystallographic orientation is determined after indexing of the corresponding diffraction pattern. Combined use of EBSD with commercially available software allows for texture analysis and the determination of a grain boundary character distribution (GBCD) to be conducted relatively easily. Conducting measurement and analysis on interfaces using EBSD allows for the misorientations of grain boundaries in large sample populations of interfaces to be clarified. In general, a misorientation distribution relates to the treatment conducted on a material and/or the physical properties thereof. The grain boundary misorientation can be obtained from general orientation parameters, such as the Euler angles, an angle/axis pair and the Rodrigues vector.

The CSL grain boundaries of the upper layer containing TiCN generally consist of not only Σ3 grain boundaries but also Σ5 grain boundaries, Σ7 grain boundaries, Σ9 grain boundaries, Σ11 grain boundaries, Σ13 grain boundaries, Σ15 grain boundaries, Σ17 grain boundaries, Σ19 grain boundaries, Σ21 grain boundaries, Σ23 grain boundaries, Σ25 grain boundaries, Σ27 grain boundaries and Σ29 grain boundaries. Σ3 grain boundaries can be considered to have the lowest grain boundary energy from among the CSL grain boundaries of the upper layer containing TiCN. As used herein, a length of Σ3 grain boundaries refers to a total length of Σ3 grain boundaries located in a visual field (a specific region) observed by an SEM with EBSD. This Σ3 grain boundary has a high coincidence lattice site density and low grain boundary energy compared with the other CSL grain boundaries. In other words, a Σ3 grain boundary is a CSL grain boundary involving a large number of matching lattice sites, and two grains involving a Σ3 grain boundary as their grain boundary show behavior close to that of monocrystals or twin crystals, thereby indicating the tendency of the crystal grains to be larger. Further, a greater grain size shows the tendency of the coating property, such as chipping resistance, to be degraded.

As used herein, all grain boundaries refer to a total of all of the grain boundaries other than CSL grain boundaries, and the CSL grain boundaries. The grain boundaries other than CSL grain boundaries are hereinafter referred to as "general grain boundaries." General grain boundaries refer to the remaining grain boundaries obtained by subtracting CSL grain boundaries from all the grain boundaries of the grains of the upper layer containing TiCN when an observation is made using an SEM with EBSD. Therefore, a "total length of all grain boundaries" can be represented as a "sum of the length of CSL grain boundaries and the length of general grain boundaries."

In the present embodiment, a ratio of a length of Σ3 grain boundaries to a total 100% length of all grain boundaries in a specific region of the upper layer can be calculated as set forth below.

An observation surface is obtained by exposing a cross-sectional surface of the upper layer in a direction parallel to the surface of the substrate of a coated cutting tool. Examples of a method of exposing a cross-sectional surface of the upper layer include cutting and polishing. In particular, polishing is preferred from the perspective of obtaining a smoother observation surface of the upper layer. At this time, it is preferable to obtain an observation surface at the position where 50% or more of the average thickness of the upper layer is left in a thickness direction of the coating layer. It is more preferable to obtain an observation surface at the position where 50% or more to 90% or less of the average thickness of the upper layer is left in the thickness direction of the coating layer. In particular, from the perspective of obtaining a smoother observation surface, an observation surface is preferably a mirror-finished surface. Examples of a method of obtaining a mirror-finished observation surface of the upper layer include a polishing method with the use of diamond paste or colloidal silica, and ion milling; however, such method is not limited thereto.

Thereafter, the above observation surface is observed by an SEM with EBSD. With regard to the relevant observation region, it is preferable to observe a flat surface (e.g., a flank).

SU6600 (manufactured by Hitachi High-Technologies Corporation) with EBSD (manufacture by TexSEM Laboratories, Inc.) is used as the SEM.

A normal of an observation surface is inclined by 70° with respect to an incident beam, and in an analysis, the observation surface is irradiated with an electron beam at an acceleration voltage of 15 kV and an irradiation current of 1.0 nA. On such observation surface, data collection is performed on 500×300 points, which correspond to a surface region of 50 μm×30 μm, with a step size of 0.1 μm.

Data processing is performed using commercially available software. Confirmation can be made by: counting the CSL grain boundaries which match an arbitrary Σ value; and representing the result as a ratio of such CSL grain boundaries to all the grain boundaries. Accordingly, a length of Σ3 grain boundaries and a total length of all grain boundaries are obtained, and, based on such obtained lengths, a ratio of the length of Σ3 grain boundaries to the total length of all grain boundaries can be calculated.

In the coated cutting tool of the present embodiment, the ratio of (111)-oriented grains in the upper layer containing TiCN is 30 area % or more. In the coated cutting tool of the present embodiment, if the ratio of (111)-oriented grains in the upper layer containing TiCN is 30 area % or more, this leads to a high hardness, thereby resulting in improved crater wear resistance. From the same perspective, the ratio of (111)-oriented grains in the upper layer containing TiCN is preferably 34 area % or more. Further, in the coated cutting tool of the present embodiment, the ratio of (111)-oriented grains in the upper layer containing TiCN is preferably 55 area % or less. In the coated cutting tool of the present embodiment, if the ratio of (111)-oriented g rains in the upper layer containing TiCN is 55 area % or less, this leads to excellent balance between hardness and toughness, thereby resulting in the tendency of the chipping resistance to be improved. From the same perspective, the ratio of (111)-oriented grains in the upper layer containing TiCN is more preferably 50 area % or less.

In the present embodiment, a ratio of (111)-oriented grains in the upper layer refers to a ratio (unit:area %) of the cross-sectional areas of grains, each of which has a misorientation ranging from 0 degrees or more to below 10 degrees, to the cross-sectional areas of grains, each of which has a misorientation ranging from 0 degrees or more to 45 degrees or less. As used herein, a misorientation refers to, as to a cross-sectional surface which is located within 1 μm below the surface of the upper layer toward the substrate and is parallel to the surface of the substrate, an angle (unit: degrees) formed by a normal to the cross-sectional surface and a normal to a (111) orientation of a grain of the TiCN layer of the upper layer.

In the present embodiment, a ratio of (111)-oriented grains in the upper layer can be obtained by the method set forth below. As to a cross-sectional surface which is located within 1 μm below the surface of the upper layer toward the substrate and is parallel to the surface of the substrate, a total of the cross-sectional areas of grains, each of which has a misorientation ranging from 0 degrees or more to 45 degrees or less, being an angle formed by a normal to the cross-sectional surface and a normal to a (111) orientation of a grain in the TiCN layer of the upper layer, is defined as constituting 100 area %. Under such assumption, a ratio of a total of the cross-sectional areas of grains, each of which has a misorientation ranging from 0 degrees or more to below 10 degrees, to a total of the cross-sectional areas of grains, each of which has a misorientation ranging from 0 degrees or more to 45 degrees or less may be obtained, and the resulting ratio may be defined as a ratio of (111)-oriented grains in the upper layer. When obtaining a ratio (area %) of (111)-oriented grains in the upper layer, the cross-sectional area of each grain can be measured using, for example, an electron backscatter diffraction pattern apparatus (EBSD) incorporated in a scanning electron microscope (SEM), a field emission scanning electron microscope (FE-SEM) or the like. With EBSD, the crystal orientation of each crystal from among the grains is determined, and the cross-sectional area of the grain with the determined crystal orientation is classified into one of the divisions in, for example, respective 5-degree pitches, and the cross-sectional areas of the grains for each division are obtained. Thereafter, for instance, a total of the cross-sectional areas of grains is obtained for the following divisions: a division with a misorientation ranging from 0 degrees or more to below 10 degrees; a division with a misorientation ranging from 10 degrees or more to below 20 degrees; a division with a misorientation ranging from 20 degrees or more to below 30 degrees; and a division with a misorientation ranging from 30 degrees or more to 45 degrees or less. In this case, a total of the cross-sectional areas of grains, each of which has a misorientation ranging from 0 degrees or more to 45 degrees or less constitutes 100 area %. With regard to the above divisions, a ratio of a total of the cross-sectional areas of grains, each of which has a misorientation ranging from 0 degrees or more to below 10 degrees, to a total of the cross-sectional areas of grains, each of which has a misorientation ranging from 0 degrees or more to 45 degrees or less, can be calculated as a ratio of (111)-oriented grains.

In the upper layer used in the present embodiment, the content of chlorine (Cl) is preferably 0.1 atom % or less. In the coated cutting tool of the present embodiment, if the content of Cl in the upper layer containing TiCN is 0.1 atom % or less, this leads to a high hardness, thereby resulting in the tendency of the wear resistance to be improved. The lower limit of the content of Cl in the upper layer is not particularly limited; however, such lower limit may be, for example, 0 atom %.

It should be noted that, in the present embodiment, the content of chlorine (Cl) can be measured by the method described in the Examples below.

The average thickness of the upper layer used in the present embodiment is from 1.5 μm or more to 6.5 μm or less. In the coated cutting tool of the present embodiment, if the average thickness of the upper layer is 1.5 μm or more, this achieves the effect of providing the upper layer, and, if the average thickness of the upper layer is 6.5 μm or less, the peeling of the coating layer is suppressed, and this mainly serves as a factor for the tendency of the fracture resistance to be improved. From the same perspective, the average thickness of the upper layer is preferably from 2.0 μm or more to 6.0 μm or less.

The upper layer may contain TiCN, and may or may not contain components other than TiCN, as long as it provides the operation and effects of the present invention.

In the coated cutting tool of the present embodiment, each of the layers which constitute the coating layer may be formed by chemical vapor deposition or by physical vapor deposition. Specific examples of a method of forming the layers of the coating layer include the method set forth below. However, the method of forming such layers is not limited thereto.

(Chemical Vapor Deposition)

For instance, a Ti compound layer, being comprised of a Ti nitride layer (hereinafter also referred to as a "TiN layer"), can be formed by chemical vapor deposition with a raw material composition of $TiCl_4$: from 5.0 mol % or more to 10.0 mol % or less, $N_2$: from 20 mol % or more to 60 mol % or less, and $H_2$: the balance, a temperature of from 850° C. or higher to 950° C. or lower, and a pressure of from 300 hPa or higher to 400 hPa or lower.

A Ti compound layer, being comprised of a Ti carbide layer (hereinafter also referred to as a "TiC layer"), can be formed by chemical vapor deposition with a raw material composition of $TiCl_4$: from 1.5 mol % or more to 3.5 mol % or less, $CH_4$: from 3.5 mol % or more to 5.5 mol % or less, and $H_2$: the balance, a temperature of from 950° C. or higher to 1,050° C. or lower, and a pressure of from 70 hPa or higher to 80 hPa or lower.

A Ti compound layer, being comprised of a Ti carbonitride layer (hereinafter also referred to as a "TiCN layer"), can be formed by chemical vapor deposition with a raw material composition of $TiCl_4$: from 5.0 mol % or more to 7.0 mol % or less, $CH_3CN$: from 0.5 mol % or more to 1.5 mol % or less, and $H_2$: the balance, a temperature of from 800° C. or higher to 900° C. or lower, and a pressure of from 60 hPa or higher to 80 hPa or lower.

A Ti compound layer, being comprised of a Ti oxycarbonitride layer (hereinafter also referred to as a "TiCNO layer"), can be formed by chemical vapor deposition with a raw material composition of $TiCl_4$: from 3.0 mol % or more to 4.0 mol % or less, CO: from 0.5 mol % or more to 1.0 mol % or less, $N_2$: from 30 mol % or more to 40 mol % or less, and $H_2$: the balance, a temperature of from 950° C. or higher to 1,050° C. or lower, and a pressure of from 50 hPa or higher to 150 hPa or lower.

A Ti compound layer, being comprised of a Ti carboxide layer (hereinafter also referred to as a "TiCO layer"), can be formed by chemical vapor deposition with a raw material composition of $TiCl_4$: from 1.0 mol % or more to 2.0 mol % or less, CO: from 2.0 mol % or more to 3.0 mol % or less, and $H_2$: the balance, a temperature of from 950° C. or higher to 1,050° C. or lower, and a pressure of from 50 hPa or higher to 150 hPa or lower.

An intermediate layer, being comprised of an $\alpha\text{-}Al_2O_3$ layer (hereinafter also simply referred to as an "$Al_2O_3$ layer"), can be obtained by, for example, the method set forth below.

Firstly, a lower layer, being comprised of one or more Ti compound layers, is formed on a surface of a substrate. Next, from among such layers, a surface of a layer which is most distant from the substrate is oxidized. Thereafter, an intermediate layer including an $\alpha\text{-}Al_2O_3$ layer is formed on the surface of the layer which is most distant from the substrate.

More specifically, the oxidation of the surface of the layer which is most distant from the substrate is performed under the conditions of a gas composition of $CO_2$: from 0.3 mol % or more to 1.0 mol % or less and $H_2$: the balance, a temperature of from 950° C. or higher to 1,050° C. or lower, and a pressure of from 50 hPa or higher to 70 hPa or lower (an oxidation step). Here, the oxidation process time is preferably from 1 minute or more to 3 minutes or less.

The $\alpha\text{-}Al_2O_3$ layer is then formed by chemical vapor deposition with a raw material gas composition of $AlCl_3$: from 2.0 mol % or more to 5.0 mol % or less, $CO_2$: from 2.5 mol % or more to 4.0 mol % or less, HCl: from 2.0 mol % or more to 3.0 mol % or less, $H_2S$: from 0.30 mol % or more to 0.40 mol % or less, and $H_2$: the balance, a temperature of from 950° C. or higher to 1,050° C. or lower, and a pressure of from 60 hPa or higher to 80 hPa or lower (a deposition step).

Further, an upper layer, being comprised of a Ti carbonitride layer (hereinafter referred to as a "TiCN layer"), is formed on a surface of the $\alpha\text{-}Al_2O_3$ layer.

A TiCN layer can be formed by chemical vapor deposition with a raw material composition of $TiCl_4$: from 7.0 mol % or more to 8.0 mol % or less, $CH_3CN$: from 0.7 mol % or more to 2.0 mol % or less, $N_2$: 15.0 mol % or more to 25.0 mol % or less, and $H_2$: the balance, a temperature of from 980° C. or higher to 1,050° C. or lower, and a pressure of from 70 hPa or higher to 120 hPa or lower (an upper layer formation step).

In order to allow the ratio (area %) of (111)-oriented grains in the upper layer to have a specific value or more, in the upper layer formation step, the temperature may be controlled, or the ratio of $CH_3CN$ in the raw material composition may be controlled. More specifically, the temperature in the upper layer formation step may be increased, or the ratio of $CH_3CN$ in the raw material composition may be increased, thereby leading to an increased ratio (area %) of (111)-oriented grains in the upper layer.

In order to allow the ratio of a length of Σ3 grain boundaries to a total 100% length of all grain boundaries in the upper layer to fall within a specific range, in the upper layer formation step, the pressure may be controlled, or the ratio of $TiCl_4$ and/or $N_2$ in the raw material composition may be controlled. More specifically, the pressure in the upper layer formation step may be decreased, or the ratio of $TiCl_4$ and/or $N_2$ in the raw material composition may be increased, thereby leading to an increased ratio (%) of a length of Σ3 grain boundaries in the upper layer.

Further, in order to allow the content (atom %) of chlorine (Cl) in the upper layer to have a specific value or less, in the upper layer formation step, the temperature and/or the pressure may be controlled. More specifically, the temperature in the upper layer formation step may be increased, or the pressure therein may be decreased, thereby leading to a decreased content (atom %) of chlorine (Cl) in the upper layer.

The thickness of each layer in the coating layer of the coated cutting tool of the present embodiment can be measured by observing a cross-sectional structure of the coated cutting tool, using an optical microscope, a scanning electron microscope (SEM), a field emission scanning electron microscope (FE-SEM), or the like. It should be noted that, as to the average thickness of each layer in the coated cutting tool of the present embodiment, such average thickness can be obtained by: measuring the thickness of each layer at three or more locations near the position 50 μm from the edge, toward the center of the rake surface of the coated cutting tool; and calculating the arithmetic mean of the resulting measurements. Further, the composition of each layer in the coating layer of the coated cutting tool of the present embodiment can be measured from a cross-sectional structure of the coated cutting tool, using an energy-dispersive X-ray spectroscope (EDS), a wavelength-dispersive X-ray spectroscope (WDS), or the like.

The coated cutting tool of the present embodiment can be considered to bring about the effect of being capable of extending the tool life more than that involved in the prior art due to the point of having excellent fracture resistance and wear resistance. In particular, in the coated cutting tool of the present embodiment, a load works under conditions which allow for a high-feed-rate and a large depth of cut and the falling of grains is suppressed under cutting conditions which do not involve a rapid increase in the cutting temperature, thereby resulting in improved crater wear resistance and suppressing the progress of wear in the initial period of machining and leading to improved fracture resistance; accordingly, such coated cutting tool can be considered to bring about the effect of being capable of extending the tool life more than that involved in the prior art. Further, in the coated cutting tool of the present embodiment, when the cutting temperature is high, the α-$Al_2O_3$ layer only suffers a small amount of damage, and thus, the effect of the α-$Al_2O_3$ layer is maintained for longer than that involved in the prior art, thereby resulting in improved crater wear resistance; accordingly, such coated cutting tool can be considered to bring about the effect of being capable of extending the tool life more than that involved in the prior art. However, the factor of such extension of the tool life is not limited thereto.

Examples

Although the present invention will be described in further detail below by way of examples, the present invention is not limited to such examples.

A cemented carbide with a machined insert shape of CNMG120412 and a composition of 87.0WC-8.600-2.0TiN-2.0NbC-0.4Cr3O2 (mass %) was prepared as a substrate. The edge of such substrate was subjected to round honing by means of an SiC brush, and a surface of the substrate was then washed.

[Invention Samples 1 to 11 and Comparative Samples 1 to 9]

After the substrate surface was washed, a coating layer was formed by chemical vapor deposition. Firstly, the substrate was inserted into an external heating chemical vapor deposition apparatus, and a lower layer, whose composition is shown in Table 2, was formed on the substrate surface, in the order of a first layer, a second layer and a third layer, so as to have the respective average thicknesses shown in Table 2 under the raw material gas composition, temperature and pressure conditions shown in Table 1. Then, the surface of the lower layer was oxidized for 1 minute under the conditions of: a gas composition of $CO_2$: 0.5 mol % and $H_2$: 99.5 mol %, a temperature of 1,000° C., and a pressure of 60 hPa. Next, an intermediate layer, being comprised of α-aluminum oxide, was formed on the oxidized surface of the lower layer so as to have the average thickness shown in Table 2 under the raw material gas composition, temperature and pressure conditions shown in Table 1. Lastly, an upper layer, whose composition is shown in Table 2, was formed on the surface of the intermediate layer so as to have the average thickness shown in Table 2 under the raw material gas composition, temperature and pressure conditions shown in Table 3. As a result, the coated cutting tools of invention samples 1 to 11 and comparative samples 1 to 9 were obtained.

TABLE 1

| Each layer composition | | Temperature (° C.) | Pressure (hPa) | Raw material gas composition (mol %) |
|---|---|---|---|---|
| Lower layer | TiN | 900 | 350 | $TiCl_4$: 7.5%, $N_2$: 40.0%, $H_2$: 52.5% |
| | TiC | 1,000 | 75 | $TiCl_4$: 2.4%, $CH_4$: 4.6%, $H_2$: 93.0% |
| | TiCN | 850 | 70 | $TiCl_4$: 6.0%, $CH_3CN$: 1.0%, $H_2$: 93.0% |
| | TiCNO | 1,000 | 100 | $TiCl_4$: 3.5%, CO: 0.7%, $N_2$: 35.5%, $H_2$: 60.3% |
| | TiCO | 1,000 | 80 | $TiCl_4$: 1.5%, CO: 2.5%, $H_2$: 96.0% |
| Intermediate layer | α-$Al_2O_3$ | 1,000 | 70 | $AlCl_3$: 2.5%, $CO_2$: 3.0%, HCl: 2.3%, $H_2S$: 0.35%, $H_2$: 91.85% |

TABLE 2

| Sample No. | Coating layer | | | | | | | | | | | |
|---|---|---|---|---|---|---|---|---|---|---|---|---|
| | Lower layer (Ti compound layer) | | | | | | Intermediate layer | | Upper layer | | Average thickness of entire coating layer (μm) |
| | First layer | | Second layer | | Third layer | | Average thickness of lower layer (μm) | Crystal system | | Average thickness (μm) | | Average thickness (μm) |
| | Composition | Average thickness (μm) | Composition | Average thickness (μm) | Composition | Average thickness (μm) | | | Composition | | Composition | |
| Invention sample 1 | TiN | 0.2 | TiCN | 6.0 | TiCNO | 0.3 | 6.5 | α | $Al_2O_3$ | 5.0 | TiCN | 4.0 | 15.5 |
| Invention sample 2 | TiN | 0.2 | TiCN | 6.0 | TiCNO | 0.3 | 6.5 | α | $Al_2O_3$ | 5.0 | TiCN | 4.0 | 15.5 |
| Invention sample 3 | TiN | 0.2 | TiCN | 6.0 | TiCNO | 0.3 | 6.5 | α | $Al_2O_3$ | 5.0 | TiCN | 4.0 | 15.5 |

TABLE 2-continued

| | Coating layer | | | | | | | | | | Average thickness of entire coating layer (μm) |
|---|---|---|---|---|---|---|---|---|---|---|---|
| | Lower layer (Ti compound layer) | | | | | | Intermediate layer | | Upper layer | | |
| | First layer | | Second layer | | Third layer | | Average thickness of lower layer (μm) | | Average | Average | |
| Sample No. | Composition | Average thickness (μm) | Composition | Average thickness (μm) | Composition | Average thickness (μm) | | Crystal system | Composition | thickness (μm) | Composition | thickness (μm) | |
| Invention sample 4 | TiN | 0.2 | TiCN | 6.0 | TiCNO | 0.3 | 6.5 | α | Al$_2$O$_3$ | 5.0 | TiCN | 2.0 | 13.5 |
| Invention sample 5 | TiN | 0.2 | TiCN | 6.0 | TiCNO | 0.3 | 6.5 | α | Al$_2$O$_3$ | 5.0 | TiCN | 6.0 | 17.5 |
| Invention sample 6 | TiN | 0.2 | TiCN | 6.0 | TiCNO | 0.3 | 6.5 | α | Al$_2$O$_3$ | 9.0 | TiCN | 2.0 | 17.5 |
| Invention sample 7 | TiN | 0.2 | TiCN | 9.0 | TiCNO | 0.3 | 9.5 | α | Al$_2$O$_3$ | 6.0 | TiCN | 2.0 | 17.5 |
| Invention sample 8 | TiC | 0.2 | TiCN | 6.0 | TiCNO | 0.3 | 6.5 | α | Al$_2$O$_3$ | 5.0 | TiCN | 4.0 | 15.5 |
| Invention sample 9 | TiN | 0.2 | TiCN | 6.0 | TiCO | 0.3 | 6.5 | α | Al$_2$O$_3$ | 5.0 | TiCN | 4.0 | 15.5 |
| Invention sample 10 | TiN | 0.2 | TiCN | 4.0 | TiCNO | 0.3 | 4.5 | α | Al$_2$O$_3$ | 4.0 | TiCN | 2.0 | 10.5 |
| Invention sample 11 | TiN | 0.2 | TiCN | 9.0 | TiCNO | 0.3 | 9.5 | α | Al$_2$O$_3$ | 9.0 | TiCN | 4.0 | 22.5 |
| Comparative sample 1 | TiN | 0.2 | TiCN | 6.0 | TiCNO | 0.3 | 6.5 | α | Al$_2$O$_3$ | 5.0 | TiCN | 4.0 | 15.5 |
| Comparative sample 2 | TiN | 0.2 | TiCN | 6.0 | TiCNO | 0.3 | 6.5 | α | Al$_2$O$_3$ | 5.0 | TiCN | 4.0 | 15.5 |
| Comparative sample 3 | TiN | 0.2 | TiCN | 15.0 | TiCNO | 0.3 | 15.5 | α | Al$_2$O$_3$ | 15.0 | TiCN | 4.0 | 34.5 |
| Comparative sample 4 | TiN | 0.2 | TiCN | 6.0 | TiCNO | 0.3 | 6.5 | α | Al$_2$O$_3$ | 5.0 | TiN | 4.0 | 15.5 |
| Comparative sample 5 | TiN | 0.2 | TiCN | 6.0 | TiCNO | 0.3 | 6.5 | α | Al$_2$O$_3$ | 5.0 | TiN | 4.0 | 15.5 |
| Comparative sample 6 | TiN | 0.2 | TiCN | 6.0 | TiCNO | 0.3 | 6.5 | α | Al$_2$O$_3$ | 5.0 | TiCN | 4.0 | 15.5 |
| Comparative sample 7 | TiN | 0.2 | TiCN | 9.0 | TiCNO | 0.3 | 9.5 | α | Al$_2$O$_3$ | 6.0 | TiCN | 2.0 | 17.5 |
| Comparative sample 8 | TiN | 0.2 | TiCN | 6.0 | TiCNO | 0.3 | 6.5 | α | Al$_2$O$_3$ | 5.0 | TiCN | 4.0 | 15.5 |
| Comparative sample 9 | TiN | 0.2 | TiCN | 4.0 | TiCNO | 0.3 | 4.5 | α | Al$_2$O$_3$ | 4.0 | TiCN | 2.0 | 10.5 |

TABLE 3

| | Upper layer composition | Temperature (° C.) | Pressure (hPa) | Raw material gas composition (mol %) | | | | |
|---|---|---|---|---|---|---|---|---|
| | | | | TiCl$_4$ | CH$_3$CN | CH$_4$ | N$_2$ | H$_2$ |
| Invention sample 1 | TiCN | 1,000 | 80 | 7.0 | 1.0 | 0.0 | 15.0 | 77.0 |
| Invention sample 2 | TiCN | 1,000 | 80 | 7.0 | 0.9 | 0.0 | 15.0 | 77.1 |
| Invention sample 3 | TiCN | 1,020 | 80 | 8.0 | 1.0 | 0.0 | 20.0 | 71.0 |
| Invention sample 4 | TiCN | 980 | 90 | 7.0 | 1.0 | 0.0 | 15.0 | 77.0 |
| Invention sample 5 | TiCN | 1,000 | 80 | 7.0 | 1.0 | 0.0 | 15.0 | 77.0 |
| Invention sample 6 | TiCN | 1,000 | 90 | 7.0 | 1.0 | 0.0 | 15.0 | 77.0 |
| Invention sample 7 | TiCN | 1,000 | 80 | 7.0 | 0.9 | 0.0 | 15.0 | 77.1 |
| Invention sample 8 | TiCN | 1,000 | 90 | 7.0 | 1.0 | 0.0 | 15.0 | 77.0 |
| Invention sample 9 | TiCN | 1,000 | 80 | 7.0 | 1.0 | 0.0 | 15.0 | 77.0 |
| Invention sample 10 | TiCN | 1,000 | 120 | 7.0 | 0.9 | 0.0 | 15.0 | 77.1 |
| Invention sample 11 | TiCN | 1,000 | 90 | 7.5 | 0.9 | 0.0 | 20.0 | 71.6 |

TABLE 3-continued

| | Upper layer composition | Temperature (° C.) | Pressure (hPa) | Raw material gas composition (mol %) | | | | |
|---|---|---|---|---|---|---|---|---|
| | | | | TiCl$_4$ | CH$_3$CN | CH$_4$ | N$_2$ | H$_2$ |
| Comparative sample 1 | TiCN | 1,000 | 200 | 6.0 | 1.0 | 0.0 | 5.0 | 88.0 |
| Comparative sample 2 | TiCN | 1,000 | 80 | 7.0 | 0.0 | 1.5 | 15.0 | 76.5 |
| Comparative sample 3 | TiCN | 1,000 | 80 | 7.0 | 0.9 | 0.0 | 15.0 | 77.1 |
| Comparative sample 4 | TiN | 1,000 | 90 | 7.5 | 0.0 | 0.0 | 40.0 | 52.5 |
| Comparative sample 5 | TiN | 1,000 | 200 | 5.5 | 0.0 | 0.0 | 35.0 | 59.5 |
| Comparative sample 6 | TiCN | 900 | 80 | 7.0 | 1.0 | 0.0 | 10.0 | 82.0 |
| Comparative sample 7 | TiCN | 1,000 | 120 | 7.0 | 0.0 | 1.5 | 15.0 | 76.5 |
| Comparative sample 8 | TiCN | 950 | 90 | 7.0 | 0.9 | 0.0 | 15.0 | 77.1 |
| Comparative sample 9 | TiCN | 980 | 120 | 7.0 | 1.0 | 0.0 | 15.0 | 77.0 |

[Average Thickness of Each Layer]

The average thickness of each of the layers of each of the obtained samples was obtained as set forth below. That is, using an FE-SEM, such average thickness was obtained by: measuring the thickness of each layer at each of the three locations from the cross-sectional surface near the position 50 μm from the edge of the coated cutting tool, toward the center of the rake surface thereof; and calculating the arithmetic mean of the resulting measurements. The measurement results are shown in Table 2.

[Composition of Each Layer]

Using an EDS, the composition of each layer of each of the obtained samples was measured from the cross-sectional surface near the position at most 50 μm from the edge of the coated cutting tool, toward the center of the rake surface thereof. The measurement results are shown in Table 2.

[Length of Σ3 Grain Boundaries]

The length of the Σ3 grain boundaries of the upper layer of each of the obtained samples was measured as set forth below.

The coated cutting tool was polished in a direction parallel to the substrate surface until a cross-sectional surface of the upper layer was exposed so as to obtain an observation surface. At this time, such observation surface was obtained at the position where 70% of the average thickness of the upper layer is left in the thickness direction of the coating layer. Further, such obtained observation surface was polished using colloidal silica so as to obtain a mirror-finished observation surface.

Thereafter, the above observation surface was observed by an SEM with EBSD. A flank was observed as the relevant observation region.

SU6600 (manufactured by Hitachi High-Technologies Corporation) with EBSD (manufacture by TexSEM Laboratories, Inc.) was used as the SEM.

A normal of an observation surface was inclined by 70° with respect to an incident beam, and in an analysis, the observation surface was irradiated with an electron beam at an acceleration voltage of 15 kV and an irradiation current of 1.0 nA. On such observation surface, data collection was performed on 500×300 points, which correspond to a surface region of 50 μm×30 μm, with a step size of 0.1 μm.

Data processing was performed using commercially available software. Confirmation was made by: counting the CSL grain boundaries which match an arbitrary Σ value; and representing the result as a ratio of such CSL grain boundaries to all the grain boundaries. Accordingly, a length of Σ3 grain boundaries and a total length of all grain boundaries were obtained, and, based on such obtained lengths, a ratio of the length of Σ3 grain boundaries to the total length of all grain boundaries was calculated.

[Ratio of (111)-Oriented Grains]

The ratio of (111)-oriented grains in the upper layer of each of the obtained samples was calculated as set forth below.

Firstly, as to the upper layer of the obtained sample, an observation with an FE-SEM was conducted on a cross-sectional surface which was located within 0.5 μm below the surface of the upper layer toward the substrate and was parallel to the surface of the substrate, and a measurement was conducted, using EBSD incorporated in the FE-SEM, so as to obtain a total of the cross-sectional areas of grains of each layer, each of which has a misorientation ranging from 0 degrees or more to 45 degrees or less. Then, the cross-sectional area of each of the grains, each of which has a misorientation ranging from 0 degrees or more to 45 degrees or less, was classified into one of the divisions in respective 5-degree pitches, and the cross-sectional areas of the grains for each division were obtained. Next, a total of the cross-sectional areas of grains was obtained for the following divisions: a division with a misorientation ranging from 0 degrees or more to below 10 degrees; a division with a misorientation ranging from 10 degrees or more to below 20 degrees; a division with a misorientation ranging from 20 degrees or more to below 30 degrees; and a division with a misorientation ranging from 30 degrees or more to 45 degrees or less. A total of the cross-sectional areas of grains, each of which has a misorientation ranging from 0 degrees or more to 45 degrees or less, constitutes 100 area %. With regard to the above divisions, a ratio of a total of the cross-sectional areas of grains, each of which had a misorientation ranging from 0 degrees or more to below 10 degrees, to a total of the cross-sectional areas of grains, each of which had a misorientation ranging from 0 degrees or more to 45 degrees or less, was defined as a ratio of (111)-oriented grains. The measurement results are shown in Table 4. It should be noted that measurements with EBSD were performed as follows. A sample was set on an FE-SEM. The sample was irradiated with an electron beam at an incident angle of 70 degrees as well as at an acceleration voltage of 15 kV and an irradiation current of 1.0 nA. For a measurement range of 30 μm×50 μm, the misorientation of each grain and the cross-sectional area thereof were measured under the EBSD setting of a step size of 0.1 μm. The cross-sectional areas of grains in the upper layer in the measurement range were regarded as being served by a total sum of the pixels corresponding to such areas. That is, with regard to the grains of each layer, the total of the cross-sectional areas of grains for each of the divisions in respective 10 or 15-degree pitches according to the misorientation was obtained by totaling the pixels occupied by the cross-sectional surfaces of the grains relating to each division and converting the resulting total into areas.

[Content of Chlorine (Cl)]

The content of chlorine (Cl) in the upper layer of the obtained sample was measured as set forth below.

Firstly, a cross-sectional surface (mirror-finished observation surface) was prepared in the same way as in the measurement of the thickness of the coating layer. Then, the cross-sectional surface of the upper layer was measured using an electron probe micro analyzer (EPMA). Such cross-sectional surface was measured at three or more points where 50% of the thickness of the upper layer was left, and the arithmetic mean was regarded as the content of Cl. The measurement results are shown in Table 4.

TABLE 4

| | Upper layer | | |
|---|---|---|---|
| | Ratio of length of Σ3 grain boundaries (%) | Ratio of (111)-oriented grains (area %) | Content of Cl (atom %) |
| Invention sample 1 | 37 | 42 | 0 |
| Invention sample 2 | 30 | 44 | 0 |
| Invention sample 3 | 45 | 50 | 0 |
| Invention sample 4 | 25 | 38 | 0.1 |
| Invention sample 5 | 39 | 49 | 0.1 |
| Invention sample 6 | 24 | 40 | 0.1 |
| Invention sample 7 | 35 | 34 | 0 |
| Invention sample 8 | 33 | 37 | 0.1 |
| Invention sample 9 | 29 | 48 | 0 |
| Invention sample 10 | 21 | 35 | 0.1 |
| Invention sample 11 | 41 | 38 | 0 |
| Comparative sample 1 | 9 | 41 | 0.1 |
| Comparative sample 2 | 24 | 15 | 0 |
| Comparative sample 3 | 42 | 34 | 0 |
| Comparative sample 4 | 32 | 34 | 0 |
| Comparative sample 5 | 11 | 31 | 0.1 |
| Comparative sample 6 | 10 | 16 | 0.9 |
| Comparative sample 7 | 35 | 20 | 0.1 |
| Comparative sample 8 | 24 | 18 | 0.5 |
| Comparative sample 9 | 28 | 13 | 0.3 |

Cutting tests 1 and 2 were conducted using the obtained samples, i.e., invention samples 1 to 11 and comparative samples 1 to 9, under the following conditions. Cutting test 1 is a wear test for evaluating wear resistance, and cutting test 2 is a fracture test for evaluating fracture resistance. The results of the respective cutting tests are shown in Table 5.

[Cutting Test 1]
Workpiece material: SCM440 round bar
Cutting speed: 200 m/min
Feed: 0.30 mm/rev
Depth of cut: 2.0 mm
Coolant: Used
Evaluation items: A time when a sample was fractured or had a maximum flank wear width of 0.3 mm was defined as the end of the tool life, and the machining time to reach the end of the tool life was measured. Further, the damage state when the sample reached the end of the tool life was checked with an SEM.

[Cutting Test 2]
Workpiece material: S45C round bar with four grooves
Cutting speed: 120 m/min
Feed: 0.30 mm/rev
Depth of cut: 1.5 mm
Coolant: Used
Evaluation items: A time when a sample was fractured or had a maximum flank wear width of 0.3 mm was defined as the end of the tool life, and the number of shocks the sample had received until the end of the tool life was measured. The number of shocks was set at 15,000 at a maximum.

As to the machining time to reach the end of the tool life in cutting test 1 (wear test), evaluations were made with grade "A" for 21 minutes or more, grade "B" for 16 minutes or more and less than 21 minutes, and grade "C" for less than 16 minutes. Further, as to the number of shocks until the end of the tool life in cutting test 2 (fracture test), evaluations were made with grade "A" for 13,000 or more, grade "B" for 11,000 or more and 12,999 or less, and grade "C" for 10,999 or less. In such evaluations, "A" refers to excellent, "B" refers to good and "C" refers to inferior, meaning that a sample involving a larger number of "A"s or "B"s has more excellent cutting performance. The evaluation results are shown in Table 5.

TABLE 5

| | Cutting test 1 | | | Cutting test 2 | |
|---|---|---|---|---|---|
| | Machining time (min) | Damage state | Grade | Number of shocks (shocks) | Grade |
| Invention sample 1 | 21 | Normal wear | A | 15,000 | A |
| Invention sample 2 | 20 | Normal wear | B | 14,400 | A |
| Invention sample 3 | 23 | Normal wear | A | 13,500 | A |
| Invention sample 4 | 18 | Normal wear | B | 14,700 | A |
| Invention sample 5 | 23 | Normal wear | A | 13,200 | A |
| Invention sample 6 | 22 | Normal wear | A | 13,800 | A |
| Invention sample 7 | 21 | Normal wear | A | 13,500 | A |
| Invention sample 8 | 20 | Normal wear | B | 14,100 | A |
| Invention sample 9 | 19 | Normal wear | B | 14,400 | A |

TABLE 5-continued

|  | Cutting test 1 | | | Cutting test 2 | |
| --- | --- | --- | --- | --- | --- |
|  | Machining time (min) | Damage state | Grade | Number of shocks (shocks) | Grade |
| Invention sample 10 | 18 | Normal wear | B | 15,000 | A |
| Invention sample 11 | 24 | Normal wear | A | 13,200 | A |
| Comparative sample 1 | 10 | Normal wear | C | 14,100 | A |
| Comparative sample 2 | 10 | Normal wear | C | 13,500 | A |
| Comparative sample 3 | 6 | Fracturing | C | 6,000 | C |
| Comparative sample 4 | 8 | Normal wear | C | 10,500 | C |
| Comparative sample 5 | 8 | Normal wear | C | 12,000 | B |
| Comparative sample 6 | 8 | Normal wear | C | 13,800 | A |
| Comparative sample 7 | 11 | Normal wear | C | 12,000 | B |
| Comparative sample 8 | 8 | Normal wear | C | 13,500 | A |
| Comparative sample 9 | 8 | Normal wear | C | 12,900 | B |

The results in Table 5 show that each invention sample had grade "A" or "B" in both the wear test and the fracture test. Meanwhile, as to the evaluations made on the comparative samples, each comparative sample had grade "C" in either or both of the wear test and the fracture test. In particular, in the wear test, each invention sample had grade "B" or higher while each comparative sample had grade "C." Accordingly, it is apparent that the wear resistance of each invention sample is more excellent than that of each comparative sample.

It is apparent from the above results that each invention sample has excellent wear resistance and fracture resistance, thereby resulting in a longer tool life.

INDUSTRIAL APPLICABILITY

The coated cutting tool according to the present invention has excellent wear resistance while not involving a reduction in fracture resistance so that the tool life can be extended more than that involved in the prior art, and from such perspective, the coated cutting tool has industrial applicability.

REFERENCE SIGNS LIST

1: Substrate, 2: Lower layer, 3: Intermediate layer, 4: Upper layer, 5: Coating layer, 6: Coated cutting tool.

What is claimed is:

1. A coated cutting tool comprising a substrate and a coating layer formed on a surface of the substrate, wherein:
the coating layer comprises a lower layer, an intermediate layer and an upper layer, the lower layer, the intermediate layer and the upper layer being laminated in order from the substrate side toward a surface side of the coating layer;
the lower layer comprises one Ti compound layer or two or more Ti compound layers containing a Ti compound of Ti and an element of at least one kind selected from the group consisting of C, N, O and B;
the intermediate layer contains α-$Al_2O_3$;
the upper layer contains TiCN;
an average thickness of the lower layer is from 4.0 μm or more to 10.0 μm or less;
an average thickness of the intermediate layer is from 3.0 μm or more to 10.0 μm or less;
an average thickness of the upper layer is from 1.5 μm or more to 6.5 μm or less;
a ratio of a length of Σ3 grain boundaries to a total 100% length of all grain boundaries in a specific region of the upper layer is from 20% or more to 60% or less; and
a ratio of (111)-oriented grains in the upper layer is 30 area % or more.

2. The coated cutting tool according to claim 1, wherein the ratio of (111)-oriented grains in the upper layer is 55 area % or less.

3. The coated cutting tool according to claim 1, wherein a content of chlorine (Cl) in the upper layer is 0.1 atom % or less.

4. The coated cutting tool according to claim 1, wherein an average thickness of the coating layer is from 10.0 μm or more to 25.0 μm or less.

5. The coated cutting tool according to claim 1, wherein the Ti compound layer is at least one kind selected from the group consisting of TiN, TiC, TiCN, TiCNO, TiON and $TiB_2$.

6. The coated cutting tool according to claim 1, wherein the substrate is a cemented carbide, cermet, ceramic or a cubic boron nitride sintered body.

7. The coated cutting tool according to claim 2, wherein a content of chlorine (Cl) in the upper layer is 0.1 atom % or less.

8. The coated cutting tool according to claim 2, wherein an average thickness of the coating layer is from 10.0 μm or more to 25.0 μm or less.

9. The coated cutting tool according to claim 3, wherein an average thickness of the coating layer is from 10.0 μm or more to 25.0 μm or less.

10. The coated cutting tool according to claim 7, wherein an average thickness of the coating layer is from 10.0 μm or more to 25.0 μm or less.

11. The coated cutting tool according to claim 2, wherein the Ti compound layer is at least one kind selected from the group consisting of TiN, TiC, TiCN, TiCNO, TiON and $TiB_2$.

12. The coated cutting tool according to claim 3, wherein the Ti compound layer is at least one kind selected from the group consisting of TiN, TiC, TiCN, TiCNO, TiON and $TiB_2$.

13. The coated cutting tool according to claim 4, wherein the Ti compound layer is at least one kind selected from the group consisting of TiN, TiC, TiCN, TiCNO, TiON and $TiB_2$.

14. The coated cutting tool according to claim 7, wherein the Ti compound layer is at least one kind selected from the group consisting of TiN, TiC, TiCN, TiCNO, TiON and $TiB_2$.

15. The coated cutting tool according to claim 8, wherein the Ti compound layer is at least one kind selected from the group consisting of TiN, TiC, TiCN, TiCNO, TiON and $TiB_2$.

16. The coated cutting tool according to claim 9, wherein the Ti compound layer is at least one kind selected from the group consisting of TiN, TiC, TiCN, TiCNO, TiON and $TiB_2$.

17. The coated cutting tool according to claim 10, wherein the Ti compound layer is at least one kind selected from the group consisting of TiN, TiC, TiCN, TiCNO, TiON and $TiB_2$.

18. The coated cutting tool according to claim 2, wherein the substrate is a cemented carbide, cermet, ceramic or a cubic boron nitride sintered body.

19. The coated cutting tool according to claim 3, wherein the substrate is a cemented carbide, cermet, ceramic or a cubic boron nitride sintered body.

20. The coated cutting tool according to claim 4, wherein the substrate is a cemented carbide, cermet, ceramic or a cubic boron nitride sintered body.

* * * * *